United States Patent
Ma et al.

(10) Patent No.: US 12,051,585 B2
(45) Date of Patent: Jul. 30, 2024

(54) MONOLAYER GRAPHENE ON NON-POLAR FACE SiC SUBSTRATE AND CONTROL METHOD THEREOF

(71) Applicant: TIANJIN UNIVERSITY, Tianjin (CN)

(72) Inventors: Lei Ma, Tianjin (CN); Walter Alexander De Heer, Tianjin (CN); Peixuan Ji, Tianjin (CN); Kaimin Zhang, Tianjin (CN); Jian Zhao, Tianjin (CN); Mei Zhao, Tianjin (CN)

(73) Assignee: TIANJIN UNIVERSITY, Tianjin (CN)

( * ) Notice: Subject to any disclaimer, the term of this patent is extended or adjusted under 35 U.S.C. 154(b) by 34 days.

(21) Appl. No.: 17/432,444

(22) PCT Filed: Feb. 28, 2019

(86) PCT No.: PCT/CN2019/076541
§ 371 (c)(1),
(2) Date: Aug. 19, 2021

(87) PCT Pub. No.: WO2020/172863
PCT Pub. Date: Sep. 3, 2020

(65) Prior Publication Data
US 2022/0122832 A1    Apr. 21, 2022

(51) Int. Cl.
C30B 29/02  (2006.01)
B28D 5/04   (2006.01)
C30B 1/02   (2006.01)
H01L 21/02  (2006.01)

(52) U.S. Cl.
CPC ........ *H01L 21/02013* (2013.01); *B28D 5/045* (2013.01); *C30B 1/026* (2013.01); *C30B 29/02* (2013.01); *H01L 21/02378* (2013.01); *H01L 21/02433* (2013.01); *H01L 21/02527* (2013.01); *H01L 21/0262* (2013.01)

(58) Field of Classification Search
CPC ........ H01L 21/02013; H01L 21/02378; H01L 21/02433; H01L 21/02527; H01L 21/0262; C30B 29/02; C30B 1/026; B28D 5/045
See application file for complete search history.

(56) References Cited

U.S. PATENT DOCUMENTS

2019/0352234 A1* 11/2019 Chandrashekhar .......................... C04B 35/62884

FOREIGN PATENT DOCUMENTS

| CN | 103286672 A | 9/2013 |
| CN | 105668559 A | 6/2016 |

OTHER PUBLICATIONS

Hens et al. "large area buffer free graphene on non-polar (001) cubicsilicon carbide" Carbon vol. 80 2014 pp. 823 929.*

(Continued)

*Primary Examiner* — Robert M Kunemund

(57) ABSTRACT

The present invention provides a control method to epitaxial growth monolayer graphene, in which a monolayer graphene is epitaxially grown on a non-polar crystal face at arbitrary angle of a non-polar crystal face SiC substrate, thereby utilizing the non-polar crystal face to manipulate the electrical transport properties of graphene. A monolayer graphene having ballistic transport properties can be epitaxially grown at arbitrary angle of non-polar crystal face SiC substrate by the above-mentioned control method.

17 Claims, 18 Drawing Sheets

(56) References Cited

OTHER PUBLICATIONS

Tiras et al "effective mass electron in monolayer graphene: electron phonon interaction" Journal of Applied Physics 113, 043708 (2013).*
International Search Report of PCT/CN2019/076541.
Written Opinion of PCT/CN2019/076541.
Lin, Jing-Jing et al. "Effect of 6H—SiC (I I-20) substrate on epitaxial graphene revealed by Raman scattering", Chinese Physics B, vol. 22, No. 1, Dec. 31, 2013.
Hens, Philip et al. "Large area buffer-free graphene on non-polar (001) cubic silicon carbide", Cabbon, vol. 80, Sep. 22, 2014.
Daas, B.K. et al. "Comparison of Epitaxial Graphene Growth on Polar and Nonpolar6H—SiC Faces: On the Growth of Multilayer Films" Crystal Growth & Design, vol. 12, Jun. 6, 2012.
Ostler, Markus et al. "Direct growth of quasi-free-standing epitaxial graphene on nonpolar SiC surfaces" Physical Review B, vol. 88, Aug. 7, 2013.
Daas, B.K. et al. "Study of epitaxial graphene on non-polar 6H—SiC faces" Materials Science Forum, vol. 717-720, May 14, 2021.

\* cited by examiner

MONOLAYER GRAPHENE ON NON-POLAR FACE SiC SUBSTRATE AND CONTROL METHOD THEREOF

CROSS-REFERENCE TO RELATED APPLICATION

This Application is a national stage application of PCT/CN2019/076541. This application claims priority from PCT Application No. PCT/CN2019/076541, filed Feb. 28, 2019, the content of which is incorporated herein in the entirety by reference.

TECHNICAL FIELD

The present invention belongs to the field of semiconductor material, and particularly relates to a monolayer graphene on non-polar face SiC substrate and control method thereof.

BACKGROUND OF THE PRESENT INVENTION

With the rapid development of modern microelectronics technology, traditional silicon-based semiconductor electronic devices have been unable to suit more requirement, it is urgent to find a new basic material for electronic devices. Graphene is two-dimensional material composed of carbon atoms which arranged by hexagonal honeycomb, and it is considered to be a promising nano-electronic device material because of excellent mechanical, electronics, optical properties. Compared with mechanical exfoliated and chemical deposition method, graphene directly growth on single crystal SiC substrate can effectively avoid the introduction of defects such as wrinkles, cracks, impurity contamination and other unfavorable factors during the manufacturing process of electronic devices. Furthmore, SiC wafer as substrate could be compatible with traditional semiconductor processes. To follow the development trend, this seems to be the only basic material that can be used to prepare two-dimensional nano-electronic devices.

The traditional way for epitaxial graphene generally growth on SiC (0001) or (000$\bar{1}$) plane, which the electronic property of epitaxial graphene is different from exfoliated graphene. In 2004, Walt et. al provided that sidewall graphene nanoribbons grown on SiC substrates have unique and extremely excellent electrical transport properties. However, this method is difficult to fit with modern planarized electronic processing technology, mainly because the graphene structure must growth on the side wall, which means SiC substrate must be subjected to longitudinal nano-scale micro-nano processing and subsequent heat treatment to obtain the sidewall graphene growth. But modern semiconductor processing is not fully suitable for the mature process of SiC three-dimensional nano-mechanical processing, and at the same time, since all the sidewall graphene is grown on the three-dimensional sidewall, the subsequent manufacturing of semiconductor devices increases a lot of difficulty.

SUMMARY OF THE PRESENT INVENTION

In order to at least partially overcome the shortcomings of the prior art, the present invention aims to propose a control method to epitaxial growth monolayer graphene.

In a first aspect, the present invention provides a control method to epitaxial growth monolayer graphene, in which a monolayer graphene is epitaxially grown on a non-polar crystal face at arbitrary angle of a non-polar crystal face SiC substrate, thereby utilizing the non-polar crystal face to manipulate the electrical transport properties of graphene.

In a second aspect, the present invention is provided a monolayer graphene prepared by the above-mentioned control method, wherein the monolayer graphene is epitaxially grown at arbitrary angle of non-polar crystal face SiC substrate, and the electrical transport properties of the monolayer graphene are controlled at the angled non-polar crystal face.

In a third aspect, a method for preparing a non-polar crystal face SiC substrate is provided, which includes the following steps: adjust the included angle of the diamond wire relative to a SiC crystal column according to the angle between a non-polar crystal face and the (0001) or (000$\bar{1}$) plane, use the diamond wire to cut the SiC crystal column to obtain a SIC wafer; perform grinding, mechanical polishing and chemical-mechanical polishing on the SiC wafer to obtain a non-polar crystal face with atomic flatness; after the non-polar crystal face is verified, cutting the SiC wafer to obtain the non-polar crystal face SiC substrate.

In a fourth aspect, a non-polar crystal face SiC substrate is provided, which is obtained by the above mentioned preparation method.

Based on the above technical solutions, the beneficial effects of the present invention are as follows.

(1) Based on the analysis of the characteristics, growth conditions and physical mechanism of the sidewall graphene, the present invention proposed to grow graphene on any non-polar crystal face and use the nature physical properties of non-polar crystal face to grow graphene on it, and a method of controlling the properties of graphene on a large scale by using the interaction of any non-polar crystal face with graphene.

(2) It is further proposed to cut the SiC crystal directly at any angle to achieve any non-polar crystal face. According to different crystal faces of SiC having different hardness, the optimal cutting feed rate is used to achieve the desired thickness in the cutting process. At the same time, on the basis of the current technology for zero-angle polishing of SiC crystal, a polishing technology for achieving atomic level flatness of SiC on any crystal face was invented.

(3) The present invention solves the processing problems on the sidewall graphene nanoribbons, and realizes the large-scale growth of planarized monolayer graphene, in particular, a large area graphene on non-polar surface at a specific angle with extraordinary ballistic transport properties, which ushered in an era for ballistic transport of graphene electronic devices.

Figure 1:
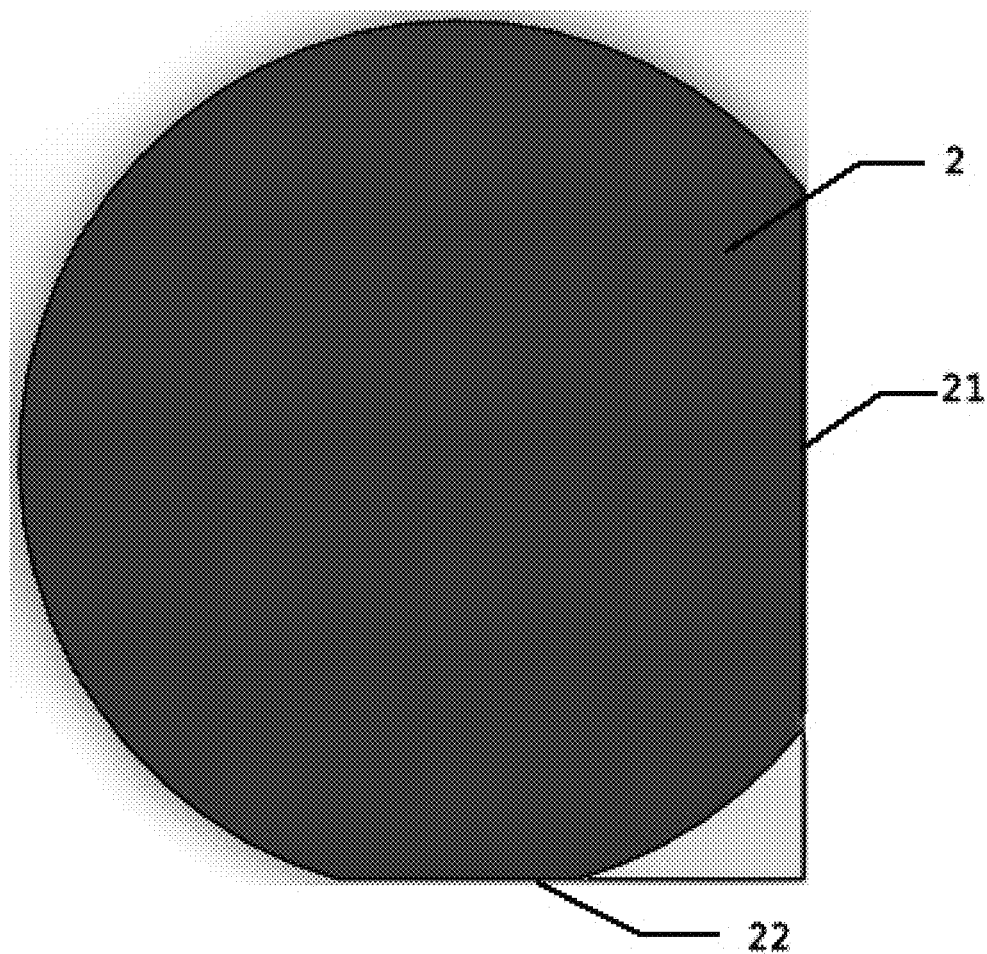
FIG. 1 shows the mutual position between two mutually perpendicular reference planes of a SiC substrate and a steel plate in the first embodiment according to the present invention.

In which,

1: fixture
2: SiC crystal column
3: steel plate
4: diamond wire
21, 22: reference plane

DETAILED DESCRIPTION OF THE PRESENT INVENTION

In order to make the objectives, technical schemes, and advantages of the present disclosure clearer, the present disclosure will be further described in detail below in conjunction with specific embodiments with reference to the accompanying drawings.

The present invention provides monolayer graphene having a non-polar crystal face SiC substrate and a control method thereof, in which a monolayer graphene is epitaxially grown on any non-polar crystal plane SiC substrate, and the properties, especially the electrical transport properties, of graphene are controlled by different non-polar crystal faces. Here, the "non-polar crystal face SiC substrate" is a SiC substrate with at least one of the upper and lower surfaces being a non-polar crystal face. Its main physical mechanism is that the physical properties of a specific crystal face of SiC influences the growth of graphene and the interaction between the specific crystal face and graphene is controlled, so that epitaxial graphene on the specific crystal face has very different physical properties from that on common (0001) and (000-1) planes. The applicant of the present invention also overcomes the following technical difficulties in the research: at present, a complete and effective process is not available for cutting and polishing non-polar crystal face SiC at any angle, and there is no universally applicable method for large-area growth of single-layer graphene on a SiC substrate having a non-polar crystal face at arbitrary angle. In particular, the present invention provides a control method to epitaxial growth monolayer graphene. By means of epitaxial growth of single-layer graphene on a non-polar crystal plane at arbitrary angle of a non-polar crystal face SiC substrate, the electrical transport properties of graphene are controlled by the non-polar crystal face.

The non-polar crystal face SiC substrate is in a hexagonal system, and preferably, is a 4H—SiC substrate or a 6H—SiC substrate, and the non-polar crystal face is preferably a (1-105) plane and forms an included angle of 37.1° with a (0001) plane.

Wherein, the non-polar crystal face SiC substrate is prepared by the following steps:

adjusting an angle of a diamond wire relative to a SiC crystal column according to an included angle between a non-polar crystal face and a (0001) plane or a (000-1) plane, using the diamond wire to cut the SiC crystal column to obtain a SiC wafer;

performing grinding, mechanical polishing, and chemical-mechanical polishing to obtain a non-polar crystal face with atomic flatness; and after the non-polar crystal face is verified, cutting the SiC wafer to obtain the non-polar crystal face SiC substrate.

Wherein, the diamond wire has a diameter of 0.2 to 0.8 mm, preferably 0.6 mm, and is fed at a speed of 1.5 mm/min to 5 mm/min, preferably 3 mm/min.

Wherein, the grinding is performed under the following conditions: a grinding disc or a piece of abrasive paper containing diamond particles having a particle size of 3 to 60 µm is used, where the grinding pressure is 20 to 250 N, and the speed of the power head and the rotating speed of the grinding disc are 30 to 80 r/min and 100 to 300 r/min, respectively.

Preferably, the grinding is performed under the following conditions: grinding discs with diamond particle sizes of 60 µm and 30 µm are used in order for grinding, where the grinding pressure is gradually increased from 100 to 200 N during grinding, and the speed of the power head and the rotating speed of the grinding disc are 60 r/min and 280 r/min, respectively.

Wherein, the mechanical polishing is performed under the following conditions: a diamond suspension with a diamond particle size of 0.05 to 9 µm is adopted, where the polishing pressure is 20 to 80 N, the polishing disc is made of synthetic filament cloth, the speed of the power head is 30 to 100 r/min, and the rotating speed of the polishing disc is 60 to 320 r/min.

Preferably, the mechanical polishing is performed under the following conditions: diamond suspensions with diamond particle sizes of 3 µm and 1 µm are adopted in order for polishing, where the polishing pressures are 80 N and 60 N, respectively, and the speed of the power head and the rotating speed of the polishing disc are 80 r/min and 310 r/min, respectively.

Wherein, the chemical-mechanical polishing is performed under the following conditions: an alkaline colloidal silica suspension is adopted, preferably with a pH value of 9 to 12, more preferably 11, where the polishing pressure is 20 to 80

N, preferably 60 N, the dropping rate of the polishing solution is 5 to 50 mL/min, preferably 40 mL/min, a polishing pad of fluff structure is adopted, the speed of the power head is 30 to 100 r/min, preferably 60 r/min, and the rotating speed of the polishing disc is 60 to 320 r/min, preferably 120 r/min.

Wherein, the SiC wafer is cut into a small wafer having a length of 3 to 8 mm and a width of 4 to 10 mm as the non-polar crystal face SiC substrate.

Graphene is grown by SiC pyrolysis by the following specific steps:
 pretreating a non-polar crystal face SiC substrate;
 heating the pretreated non-polar crystal face SiC substrate in vacuum at the temperature of 500 to 900° C. for 20 to 60 minutes, preferably at 500° C. for 60 minutes;
 heating the non-polar crystal face SiC substrate in an inert atmosphere to 1100 to 1350° C., preferably 1100° C., for 20 to 100 minutes, preferably 80 minutes, and then heated to 1500 to 1600° C., preferably 1500° C., for 20 to 150 minutes, preferably 120 minutes; and
 the growth of graphene is finished after cooling to room temperature.

Wherein, graphene may also grow by spin-coating an organic substance on the non-polar crystal face SiC substrate as a solid carbon source, and this method fills the blank that it is difficult to achieve epitaxial growth of graphene on certain non-polar crystal faces directly by pyrolysis. This method includes the following steps:
 pretreating a non-polar crystal face SiC substrate;
 spin-coating an organic substance on the pretreated non-polar crystal face SiC substrate with a thickness of 10-100 nm;
 heating the non-polar crystal face SiC substrate in vacuum at the temperature of 500 to 1000° C. for 20 to 60 minutes, preferably at 800° C. for 40 minutes;
 heating the non-polar crystal face SiC substrate in an inert atmosphere to 1200 to 1400° C., preferably 1400° C., for 20 to 100 minutes, preferably 81 minutes, and then heating to 1500 to 1700° C., preferably 1700° C., for 20 to 150 minutes, preferably 115 minutes; and
 the growth of graphene is finished after cooling to room temperature.

Wherein, the organic substance is, for example, photoresist, polystyrene or polyacrylonitrile, etc.

Further, the present invention also provides a monolayer graphene prepared by the above-mentioned control method, wherein the monolayer graphene is epitaxially grown on a non-polar crystal face at arbitrary angle of a non-polar crystal face SiC substrate, and the electrical transport properties of the monolayer graphene are controlled by the non-polar crystal face.

Based on the above, the present invention also provides a method for preparing a non-polar crystal face SiC substrate, which includes the following steps:
 Step A: adjusting an angle of a diamond wire relative to a SiC crystal column according to an included angle between a non-polar crystal face and a (0001) plane or a (000-1) plane, using the diamond wire to cut the SiC crystal column to obtain a SiC wafer;
 performing grinding, mechanical polishing, and chemical-mechanical polishing to obtain a non-polar crystal face with atomic flatness; and
 after the non-polar crystal face is verified, cutting the SiC wafer to obtain the non-polar crystal face SiC substrate; where the specific operations of the above steps are the same as those described above.

Further, the present invention provides a non-polar crystal face SiC substrate, which is obtained by the above mentioned preparation method.

Some embodiments are listed below in conjunction with the drawings to further describe the technical solution of the present invention in detail. It should be noted that the specific embodiments below are only for example, and are not used to limit the present invention.

Embodiment 1: Method for Non-Polar Face SiC Substrate Cutting

A method for accurately cutting arbitrary angle non-polar crystal face SiC, including the following steps.

(1) It is necessary to determine the included angle between the required non-polar crystal face and the (0001) plane. In this embodiment, the non-polar crystal face is (1 $\bar{1}$05) plane, which forms an included angle of 37.1° with the (0001) plane; and different non-polar crystal faces correspond to different angles in other embodiments.

Figure 2:
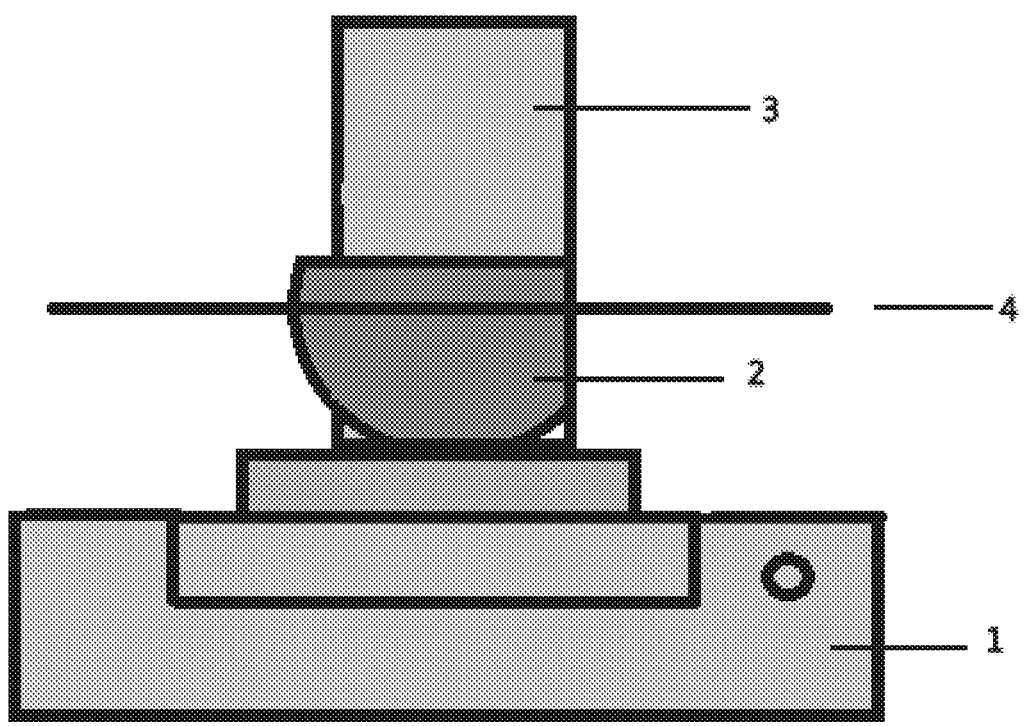
FIG. 2 is a schematic diagram of showing the SiC (0001) plane parallel to the diamond wire in the first embodiment according to the present invention.

(2) A fixture 1 is adopted to fix a SiC crystal column 2, as shown in FIG. 1, the SiC crystal column 2 has two mutually perpendicular reference planes 21 and 22. As shown in FIG. 2, a steel plate 3 is vertically arranged on the fixture 1 which can rotate 360° in the horizontal plane. The fixture 1 is required to maintain horizontal state before fixing the SiC crystal column 2, and the steel plate is in a vertical state.

When fixing the SiC crystal column 2, it is necessary to align the two mutually perpendicular reference surfaces 21, 22 of the SiC crystal column 2 with the two mutually perpendicular surfaces of the steel plate 3, so that the two reference surfaces 21, 22 of the SiC crystal column 2 are respectively horizontal and vertical planes.

(3) After fixing the SiC crystal column 2 according to the above requirements, rotate the fixture 1 in the horizontal plane to make the SiC (0001) plane parallel to the diamond wire 4.

Figure 3:
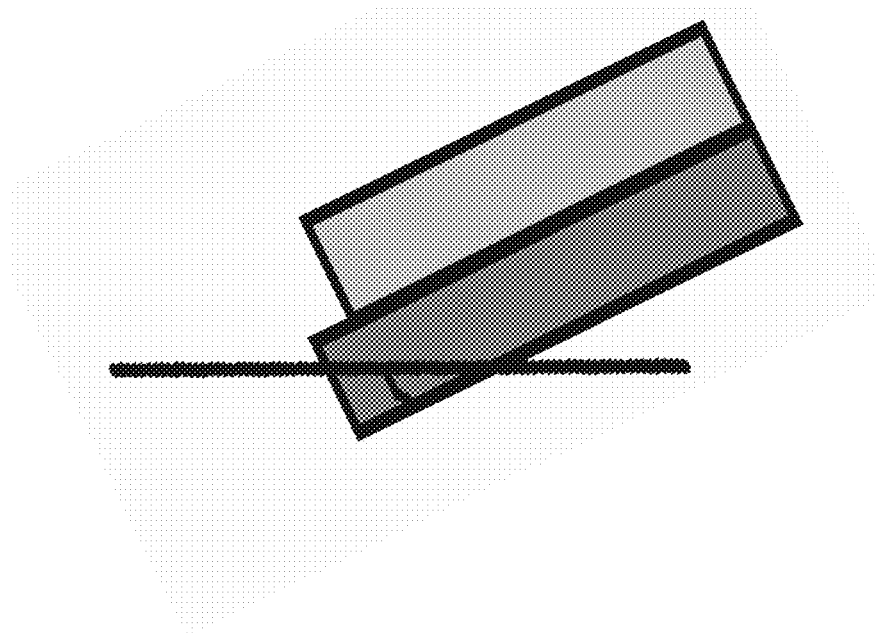
FIG. 3 is a schematic diagram of cutting a specific crystal face of SiC in the first embodiment according to the present invention.

(4) FIG. 3 shown the required non-polar crystal face for cutting the SiC crystal column 2, taking the vertical axis as the rotation axis to rotate the included angle θ between the fixture 1 and the SiC crystal column 2 by 37.1°, cutting the SiC crystal column 2 by the diamond wire 4 under the fed speed of 4.0 mm/min; and after each SiC wafer is cut, the SiC crystal column 2 is controlled to move forward a certain distance to the diamond wire 4, the distance is the sum of the thickness of the SiC wafer and the wire diameter of the diamond wire 4.

Embodiment 2: Method for Non-Polar Face SiC Substrate Grinding and Polishing

A grinding and polishing method that can obtain non-polar crystal faces at arbitrary angle of SiC substrate with atomic flatness, the specific steps are as follows:
 (1) Pasting the SiC wafer (cut in the Embodiment 1) with paraffin wax on the power head disk, and then grinding it on the polishing machine; wherein the grinding disk is diamond grinding plate, adopting the grinding plates with diamond particle sizes of 60 μm and 30 μm for polishing the SIC wafer, respectively; where the polishing pressures was gradually increased from 100 to 200N during the grinding process, and the speed of the power head and the rotating speed of the grinding disc are 60 r/min and 280 r/min, respectively. During grinding process, the water flow is kept flushing to reduce the heat which caused by friction during the grinding process.

(2) In mechanical polishing, diamond suspensions with diamond particle sizes of 3 µm and 1 µm are adopted in order for polishing, where the polishing pressures are 80 N and 60 N, respectively; the polishing plate was synthetic silk cloth with medium hardness, and the speed of the power head and the rotating speed of the polishing disc are 80 r/min and 310 r/min, respectively.
(3) Performing the chemical-mechanical polishing under the following conditions: an alkaline colloidal silica suspension with a pH value of 11 is adopted, where the dropping rate of the polishing solution is 40 mL/min, the polishing pressure is 60N, a polishing pad of fluff structure is adopted, the speed of the power head and the rotating speed of the polishing disc are 60 r/min and 120 r/min, respectively.
(4) Clean the polished SiC wafer in an ultrasonic cleaning machine heated to 50° C., and select acetone, ethanol and water for ultrasonic for 20 minutes, respectively.
(5) An X-direction instrument was adopted to verify the non-polar crystal face. By checking the table or calculate the diffraction angle of the required crystal face, and the non-polar crystal face can be directly detected if no extinction phenomenon is generated. Otherwise, the reversible rotation θ=37.1°, and the result is the diffraction angle of the (0001) crystal face to prove that the obtained crystal face is the desired non-polar crystal face.

Figure 4:
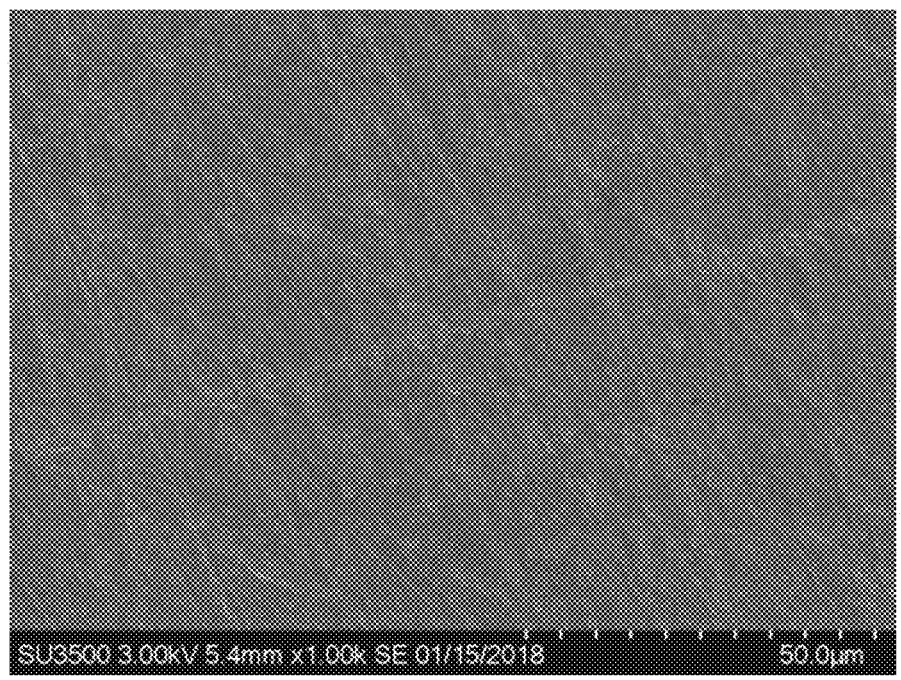
FIG. 4 is a scanning electron microscope (SEM) image of SiC after grinding in second embodiment according to the present invention.
Figure 5:
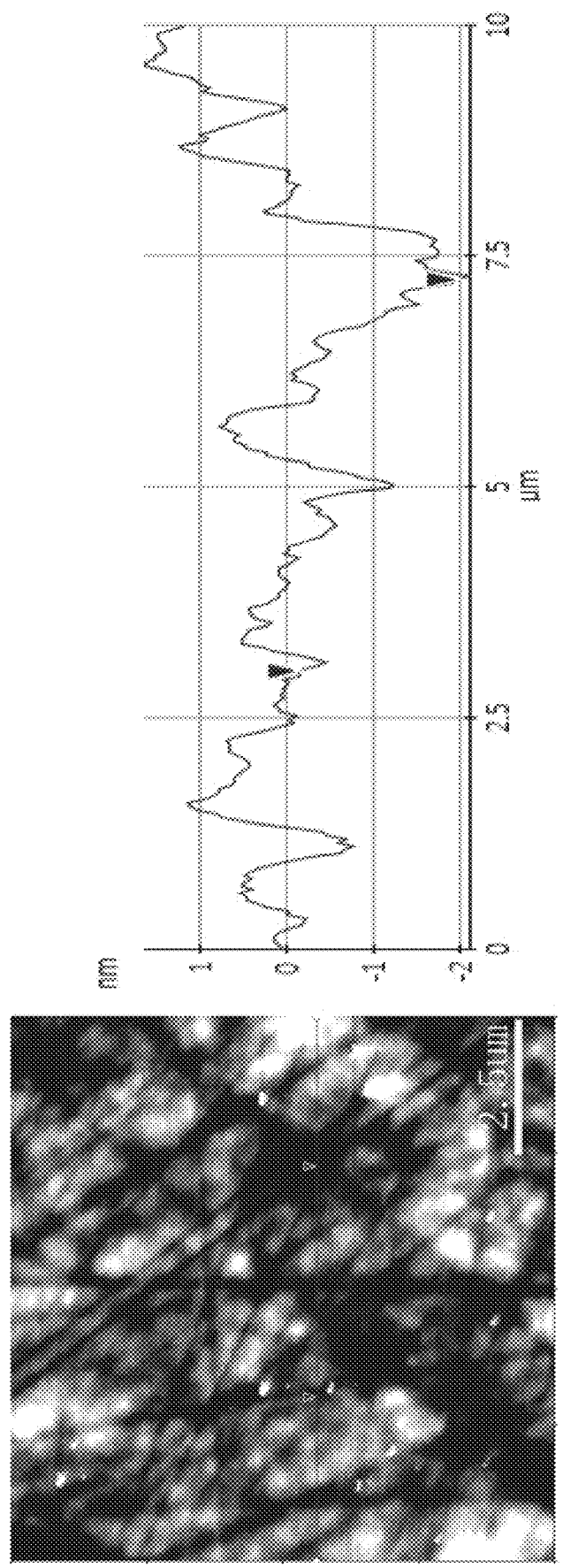
FIG. 5 is an atomic force microscope (AFM) image of SiC after mechanical polishing in the second embodiment according to the present invention.
Figure 6:
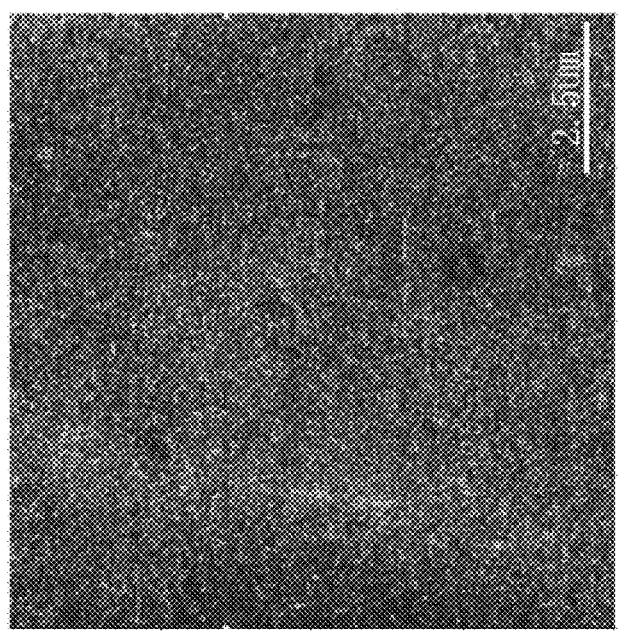
FIG. 6 is an AFM image of SiC after chemical mechanical polishing in the second embodiment according to the present invention.
Figure 6:
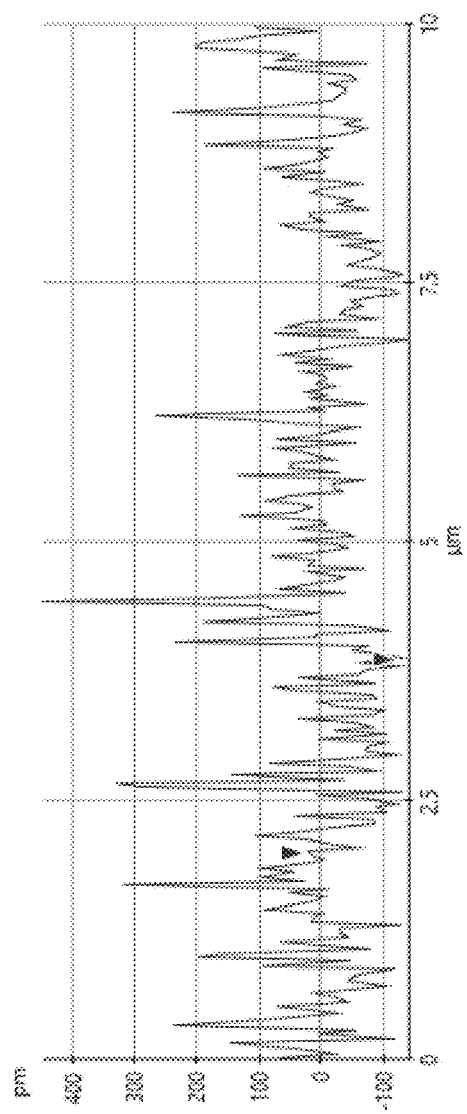

As shown in FIGS. 4-6, there are obvious deep scratches on the SiC surface after grinding (as shown in FIG. 4), and the scratches on the surface after mechanical polishing reach 2~3 nm (as shown in FIG. 5), and there no scratch on surface after chemical-mechanical polishing, the surface roughness is the order of pm (as shown in FIG. 6).

Embodiment 3: Method for Growth Large Scale Graphene on Monolayer Non-Polar Crystal Face Based on the concept of natural periodic in-situ growth of the substrate to manipulate the properties of graphene, the present invention proposed the method for growing large-area monolayer graphene on SiC substrate with non-polar crystal faces at arbitrary angle. The specific steps are as follows:
(1) Pasting the SiC wafer (grinded and polished in the Embodiment 2) with paraffin wax on the ceramic, and then cut into a 3.5×4.5 mm non-polar crystal face SiC substrate for pretreating so as to remove the paraffin wax and complete cleaning;
(2) putting the pretreated 3.5×4.5 mm non-polar crystal face SiC substrate in a new prepared graphite crucible, and then putting the graphite crucible in the heating position of the copper ring of the induction heating furnace;
(3) in the first stage, heating the non-polar crystal face SiC substrate in vacuum environment at the temperature of 500° C. for 60 minutes;
(4) in the second stage, passing high-purity argon gas with a flow rate of 500 sccm, and heating the non-polar crystal face SiC substrate at the temperature of 1100° C. for 80 minutes;
(5) in the third stage, heating the non-polar crystal face SiC substrate at the temperature of 1500° C. for 120 minutes;
(6) in the fourth stage, quickly cooling the non-polar crystal face SiC substrate to room temperature to complete the graphene growth.

Figure 7:
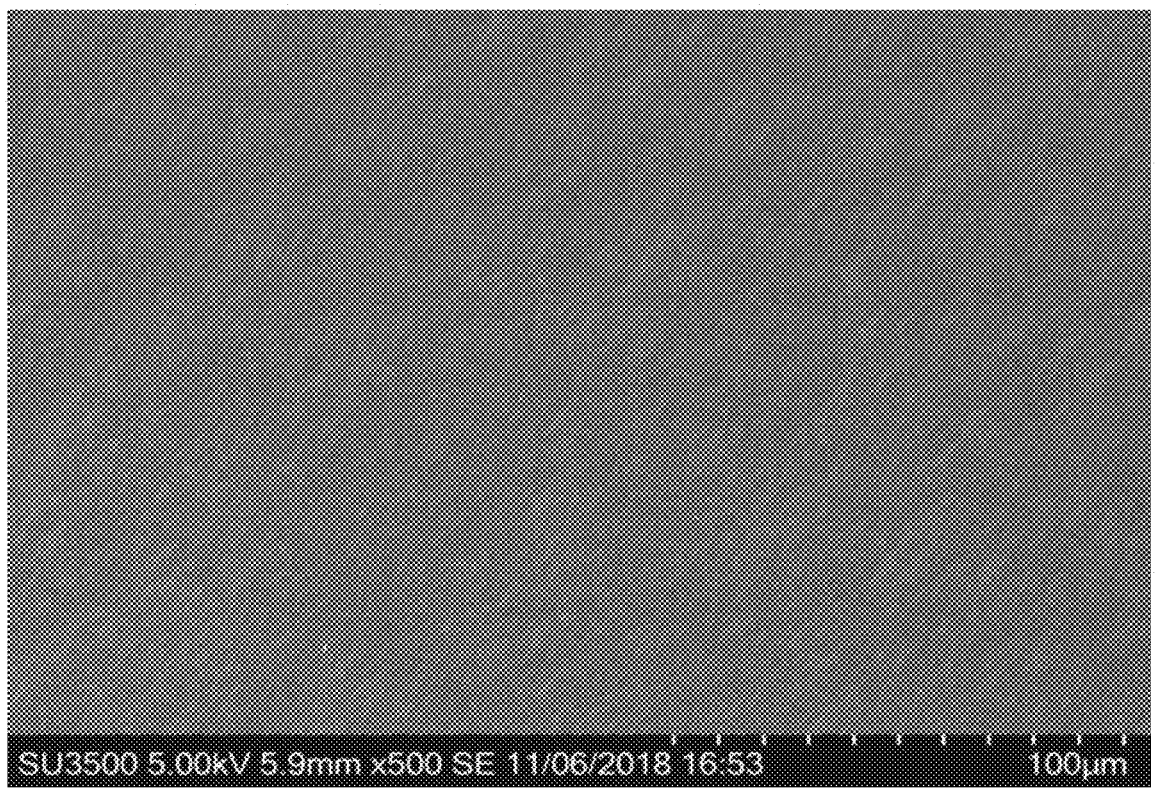
FIG. 7 is an SEM image of graphene grown in the third embodiment according to the present invention.
Figure 8:
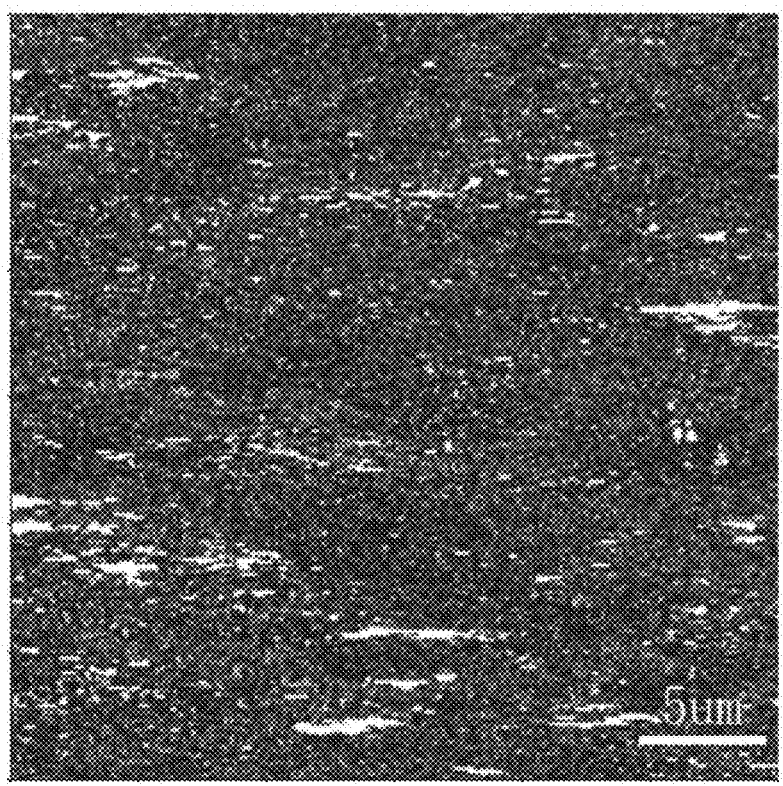
FIG. 8 is a lateral force microscope (LFM) image of graphene grown in the third embodiment according to the present invention.
Figure 9:
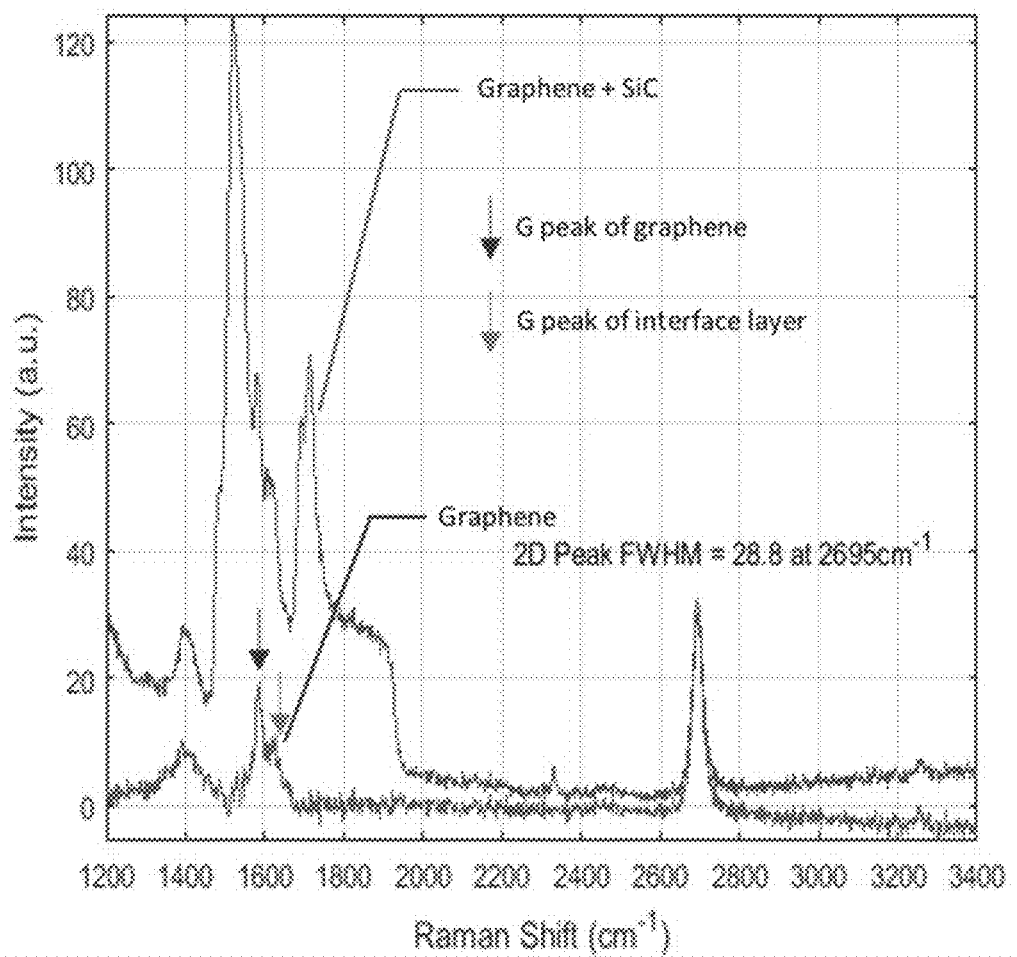
FIG. 9 shows a Raman result of graphene grown in the third embodiment according to the present invention.
Figure 10:
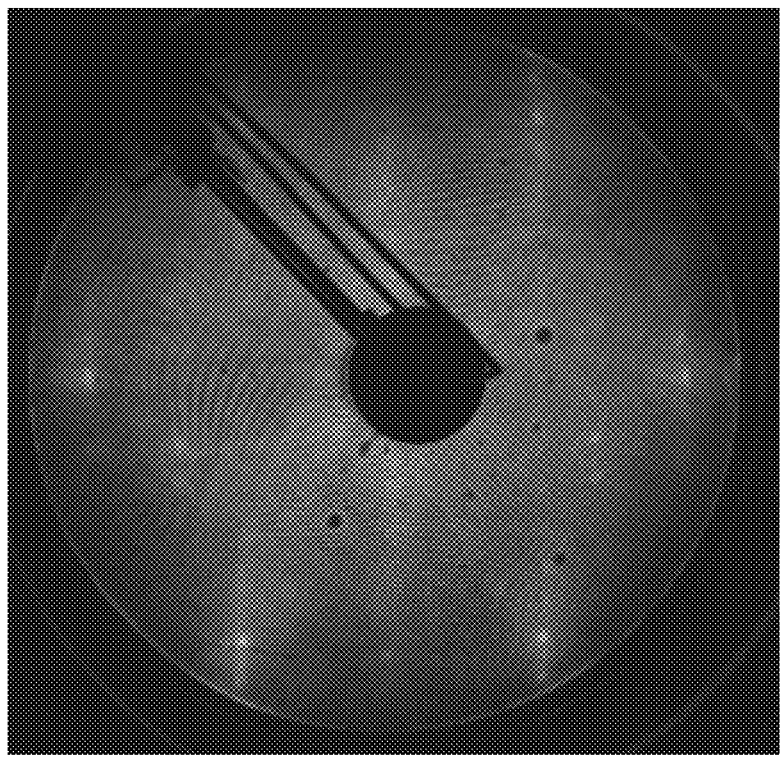
FIG. 10 is a low energy electron diffraction (LEED) image of graphene grown in the third embodiment according to the present invention.
Figure 11:
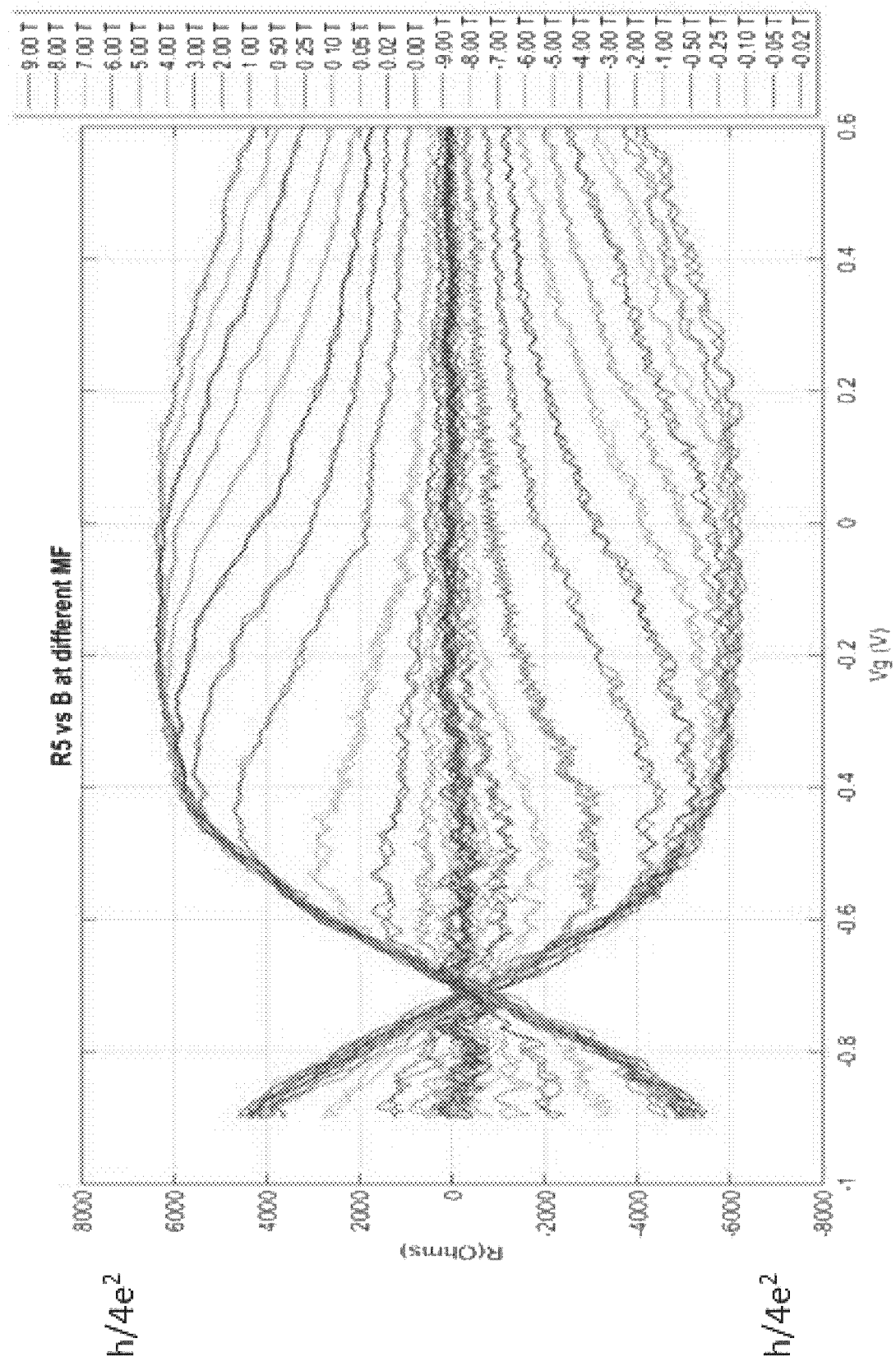
FIG. 11 shows a measurement result of the electrical transport properties of graphene with non-polar crystal faces in the third embodiment according to the present invention.

FIG. 7 shows the SEM result of growth graphene, it can be observed that all areas have the same contrast, which means the graphene all covered on the SC substrate. FIG. 8 shows the AFM result of growth graphene, the brightly colored area is SiC are and the darker color is graphene. It can be observed that the graphene is almost completely covered. FIG. 9 shows the Raman result of growth graphene, the half-height width of the 2D peak is 28.8, indicating that the obtained graphene is a monolayer graphene. From the G peak ($1580$ $cm^{-1}$) and 2D peak position ($2695$ $cm^{-1}$), there is no blue shift which means the interaction between graphene and SiC substrate is weak. As shown in FIG. 10, the spot position indicates the symmetry of graphene. FIG. 11 shown the unique quantum Hall effect of non-polar crystal face epitaxial graphene that has ballistic transport properties, which can realize electrical transport with a little power consumption.

Embodiment 4: Method for Growth Large Scale Graphene on Monolayer Non-Polar Crystal Face The difference between this embodiment and Embodiment 3 is that the crucible used for a second time. The specific steps are as follows:
(1) putting the pretreated 3.5×4.5 mm non-polar crystal face SiC substrate (same wafer in the Embodiment 3) in a graphite crucible with growth face side down, and then putting the graphite crucible in the heating position of the copper ring of the induction heating furnace;
(2) in the first stage, heating the non-polar crystal face SiC substrate in vacuum environment at the temperature of 500° C. for 60 minutes;
(3) in the second stage, passing high-purity argon gas with a flow rate of 500 sccm, and heating the non-polar crystal face SiC substrate at the temperature of 1100° C. for 80 minutes;
(4) in the third stage, heating the non-polar crystal face SiC substrate at the temperature of 1500° C. for 120 minutes;
(5) in the fourth stage, quickly cooling the non-polar crystal face SiC substrate to room temperature to complete the graphene growth.

Figure 12:
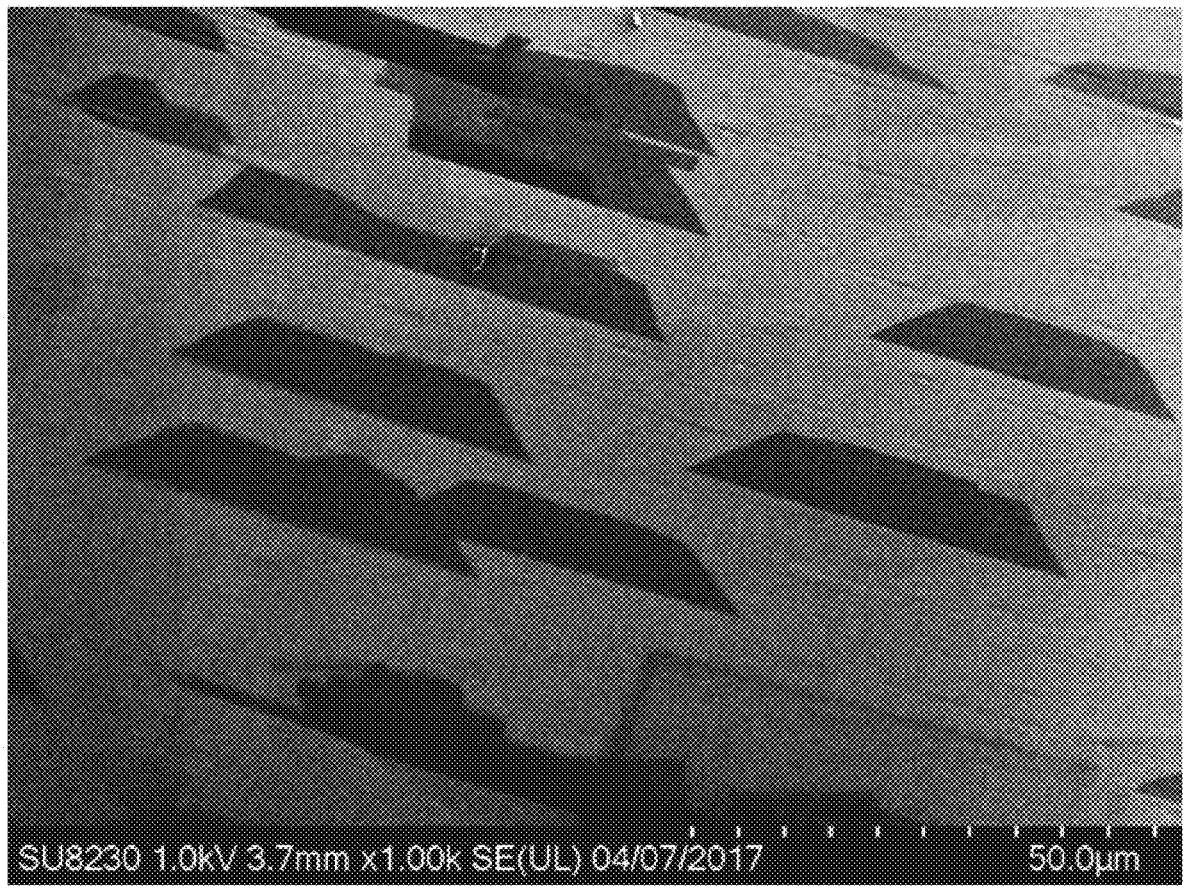
FIG. 12 is an SEM image of graphene grown in the fourth embodiment according to the present invention.
Figure 13:
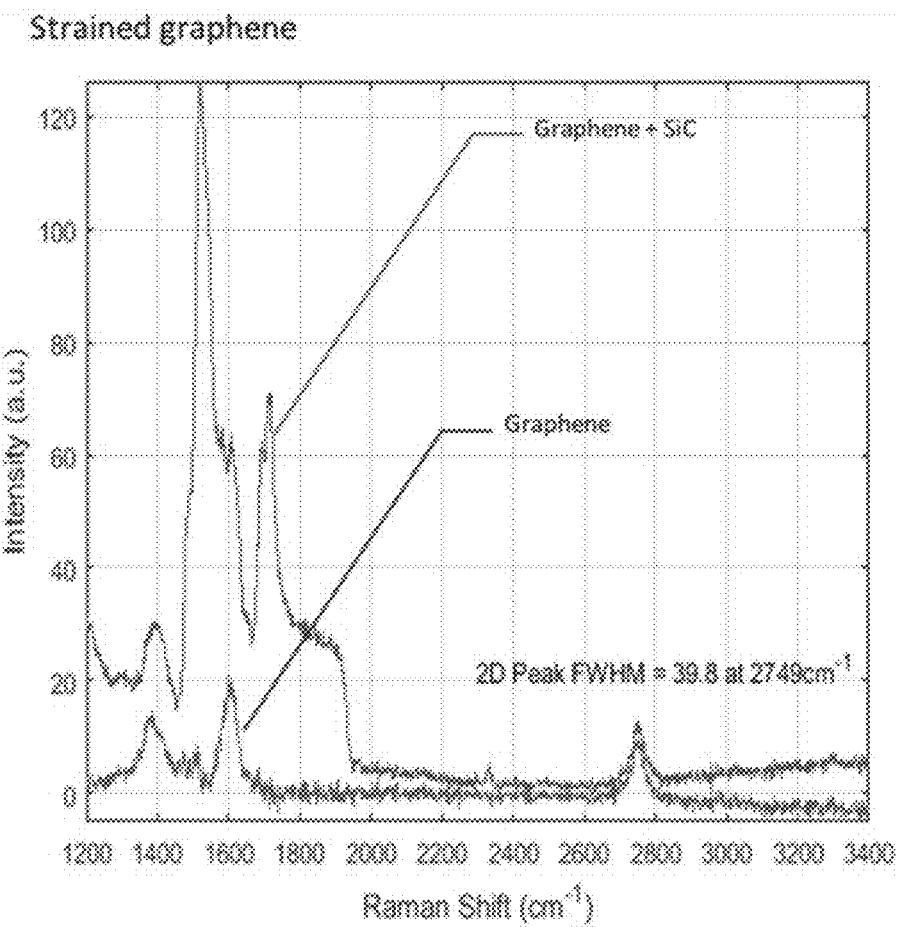
FIG. 13 shows a Raman result of graphene grown in the fourth embodiment according to the present invention.

FIG. 12 shown the AFM result of growth graphene, the brightly colored area is SiC and the darker color is graphene. It can be observed that the graphene is trapezoid. FIG. 13 shows the Raman result of growth graphene, the half-height width of the 2D peak is 39.8, indicating that the obtained graphene was a monolayer graphene. The more the crucible is used, the more the amount of silicon adhered on crucible wall, so that Si atoms are hard to evaporate from SiC substrate, thus the amount of Si atoms increased compared to the new crucible. From the G peak ($16000$ $cm^{-1}$) and 2D peak position ($2749$ $cm^{-1}$), there is blue shift which means the interaction between graphene and SiC substrate is stong.

Embodiment 5: Method for Growth Large Scale Graphene on Monolayer Non-Polar Crystal Face The difference between this embodiment and Embodiment 3 was that an organic substance was adopted as a solid carbon source for graphene growth to achieve the control of grapheme property. The specific steps are as follows:
(1) pretreating a 3.5×4.5 mm non-polar crystal face SiC substrate to remove the paraffin wax and complete cleaning; specifically, adopting hot water bath to remove paraffin wax and ultrasonically cleaned by acetone, alcohol, and deionized water for 30 minutes, respectively;

(2) drying the Sic wafer by $N_2$ gas and then spin-coating an AZ photoresist on the Sic wafer with a thickness of around 60 nm;

(3) putting the non-polar crystal face SiC substrate in a graphite crucible, and then putting the graphite crucible in the heating position of the copper ring of the induction heating furnace;

(4) in the first stage, heating the non-polar crystal face SiC substrate in vacuum environment of around $5\times10^{-6}$ mbar, at the temperature of 800° C. for 40 minutes;

(5) in the second stage, passing high-purity argon gas with a flow rate of 100 sccm, and heating the non-polar crystal face SiC substrate at the temperature of 1400° C. for 81 minutes;

(6) in the third stage, heating the non-polar crystal face SiC substrate under high-purity argon gas with a flow rate of 100 sccm, at the temperature of 1700° C. for 115 minutes;

(7) in the fourth stage, cooling the crucible to complete the graphene growth.

Figure 14:
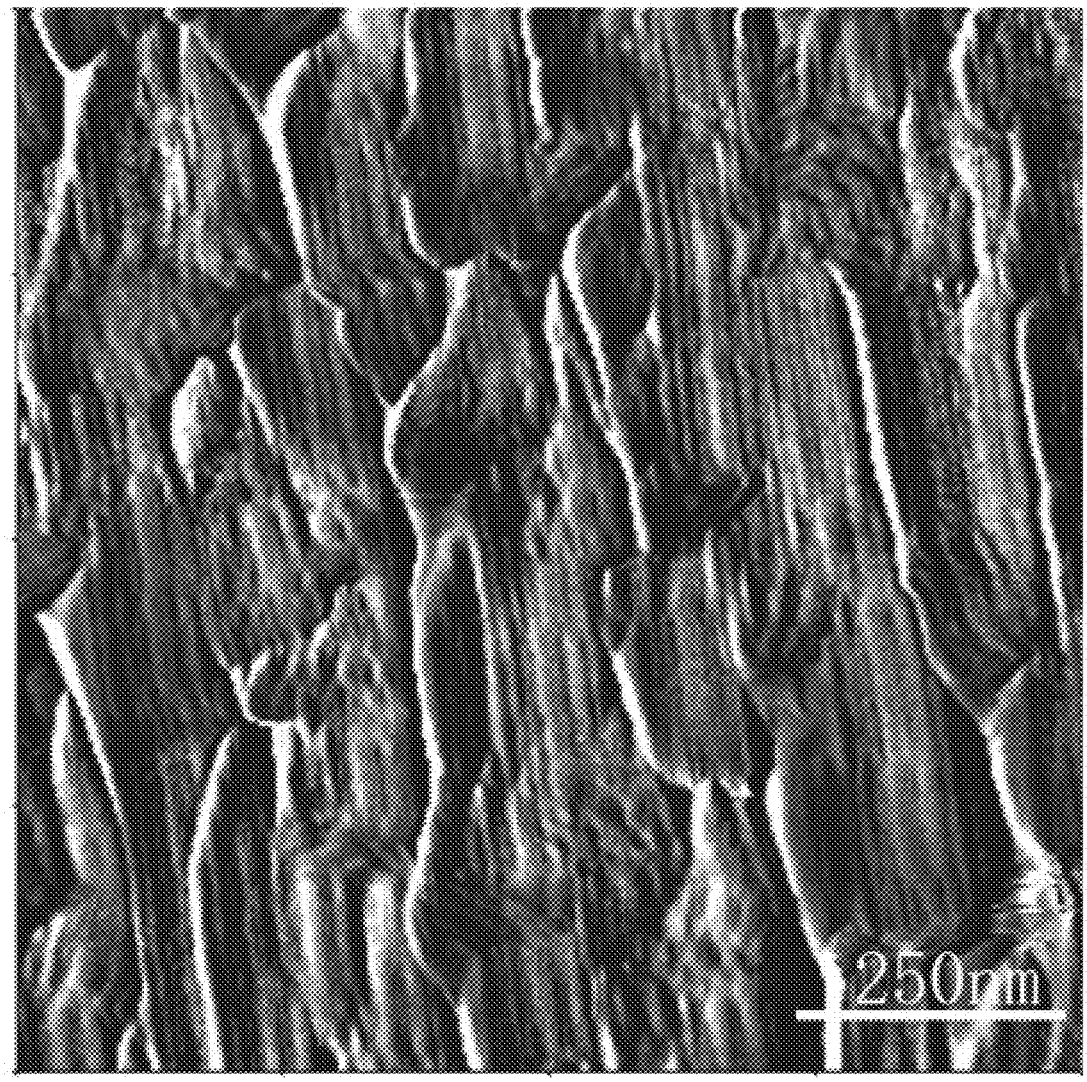
FIG. 14 is an LFM image of graphene grown in the fifth embodiment according to the present invention.
Figure 15:
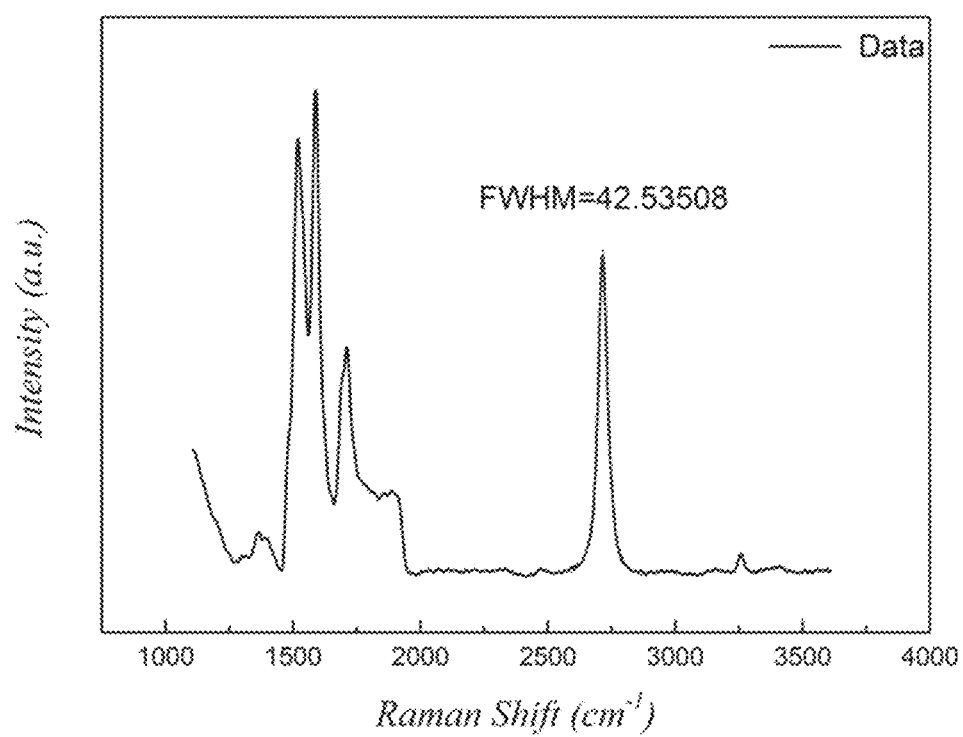
FIG. 15 shows a Raman result of graphene grown in the fifth embodiment according to the present invention.

FIG. 14 shown the AFM result of growth graphene, the brightly colored area is SiC and the darker color is graphene. It can be observed that the graphene is trapezoid. FIG. 13 shows the Raman result of growth graphene, the half-height width of the 2D peak is 39.8, indicating that the obtained graphene is a single-layer graphene. The amount of Si atoms increased compared to the new crucible on crucible wall because increased the number of crucible use, Si atoms are hard to evaporate from SiC substrate. From the G peak (16000 $cm^{-1}$) and 2D peak position (2749 $cm^{-1}$), there is blue shift which means the interaction between graphene and SiC substrate is strong.

Contrast Embodiment: Method for Growth Large Scale Graphene on a (0001) Plane SiC Substrate The specific steps are as follows:

(1) pretreating a 3.5×4.5 mm (0001) plane face SiC substrate to remove the paraffin wax and complete cleaning; specifically, adopting hot water bath to remove paraffin wax and ultrasonically cleaned by acetone, alcohol, and deionized water for 30 minutes, respectively;

(2) putting the SiC substrate in a graphite crucible, and then putting the graphite crucible in the heating position of the copper ring of the induction heating furnace;

(3) proceeding the whole growth process in vacuum environment below $5\times10^{-6}$ mbar;

(4) in the first stage, heating the SiC substrate at the temperature of 800° C. for 30 minutes;

(5) in the second stage, heating the SiC substrate at the temperature of 1200° C. for 30 minutes;

(6) in the third stage, heating the SiC substrate at the temperature of 1520° C. for 40 minutes;

(7) in the fourth stage, cooling the crucible to complete the graphene growth.

Figure 16:
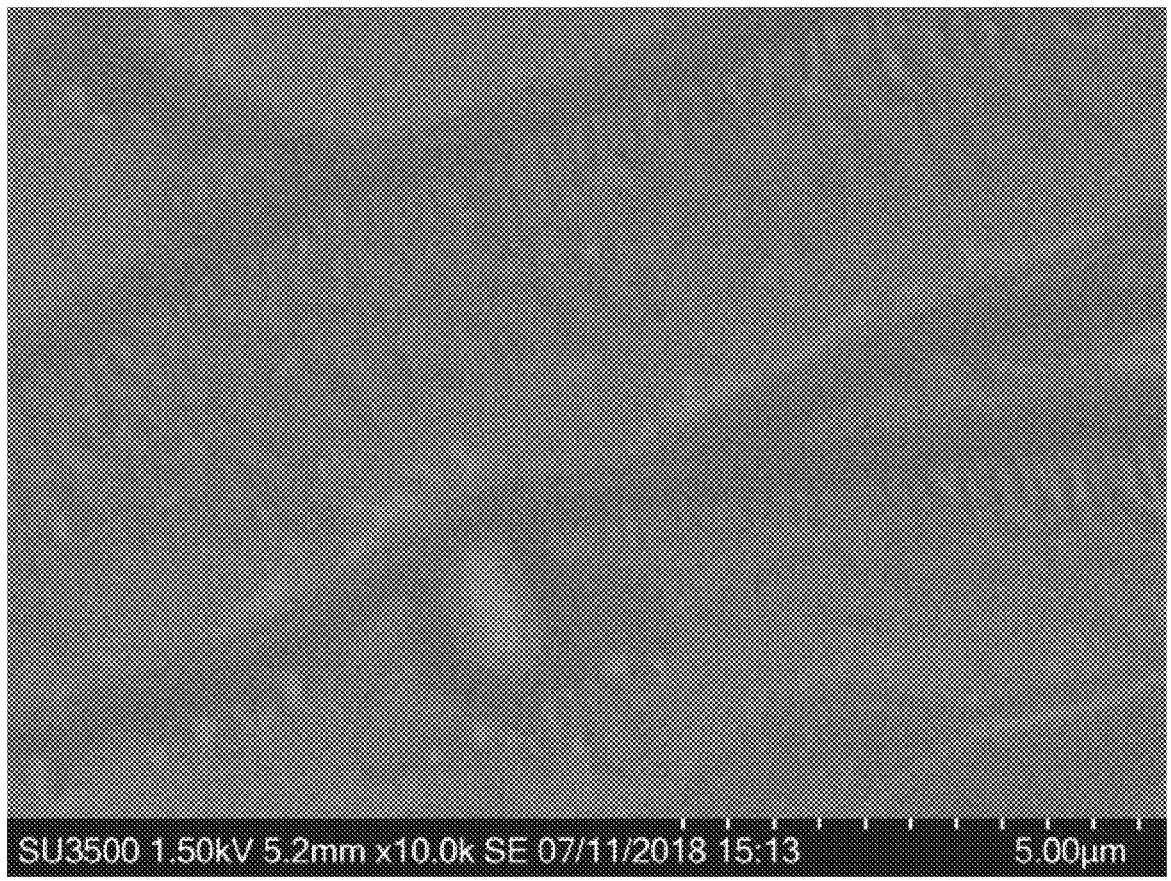
FIG. 16 is an SEM image of graphene grown in the contrast embodiment 1 of the present invention.
Figure 17:
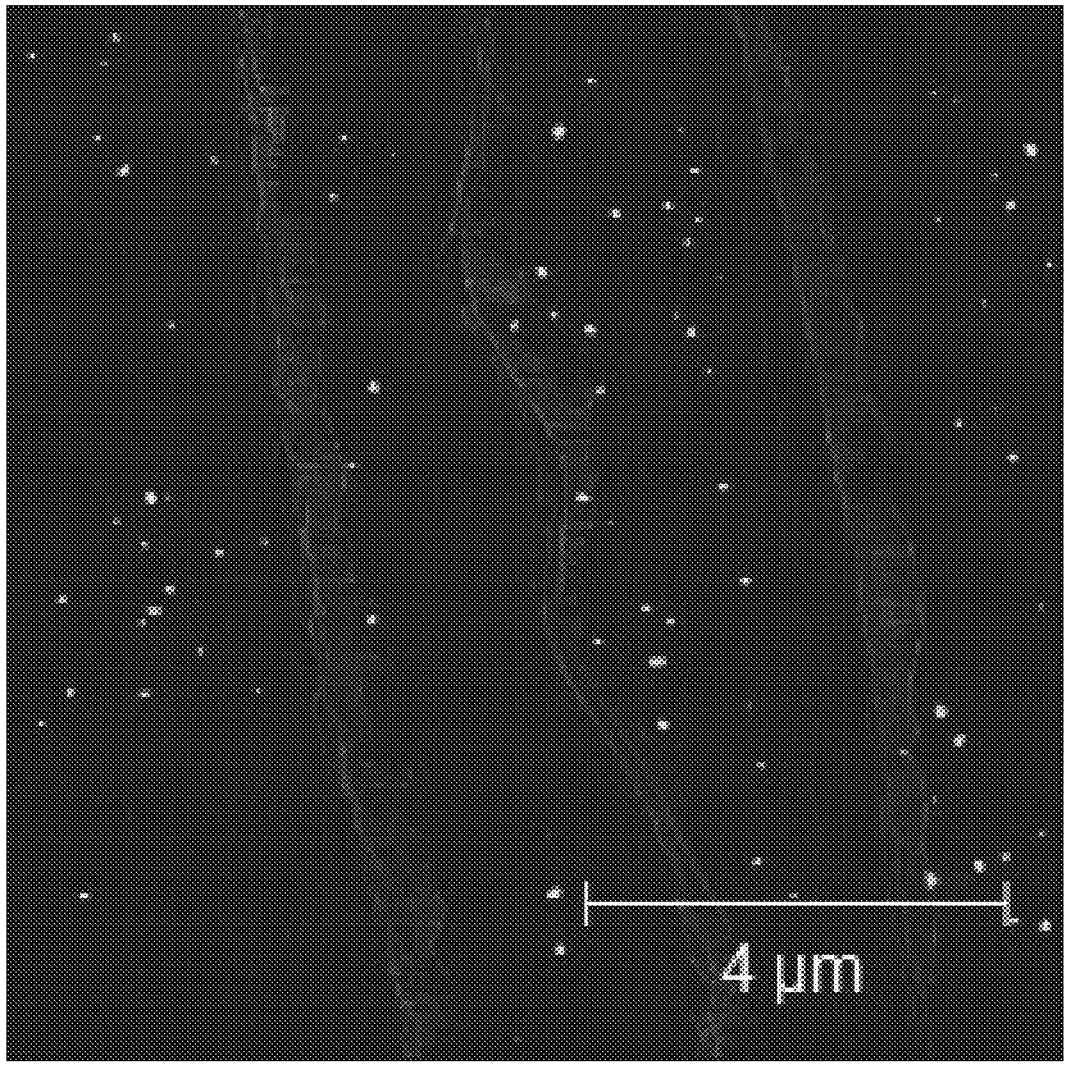
FIG. 17 is an LFM image of graphene grown in the contrast embodiment 1 of the present invention.
Figure 18:
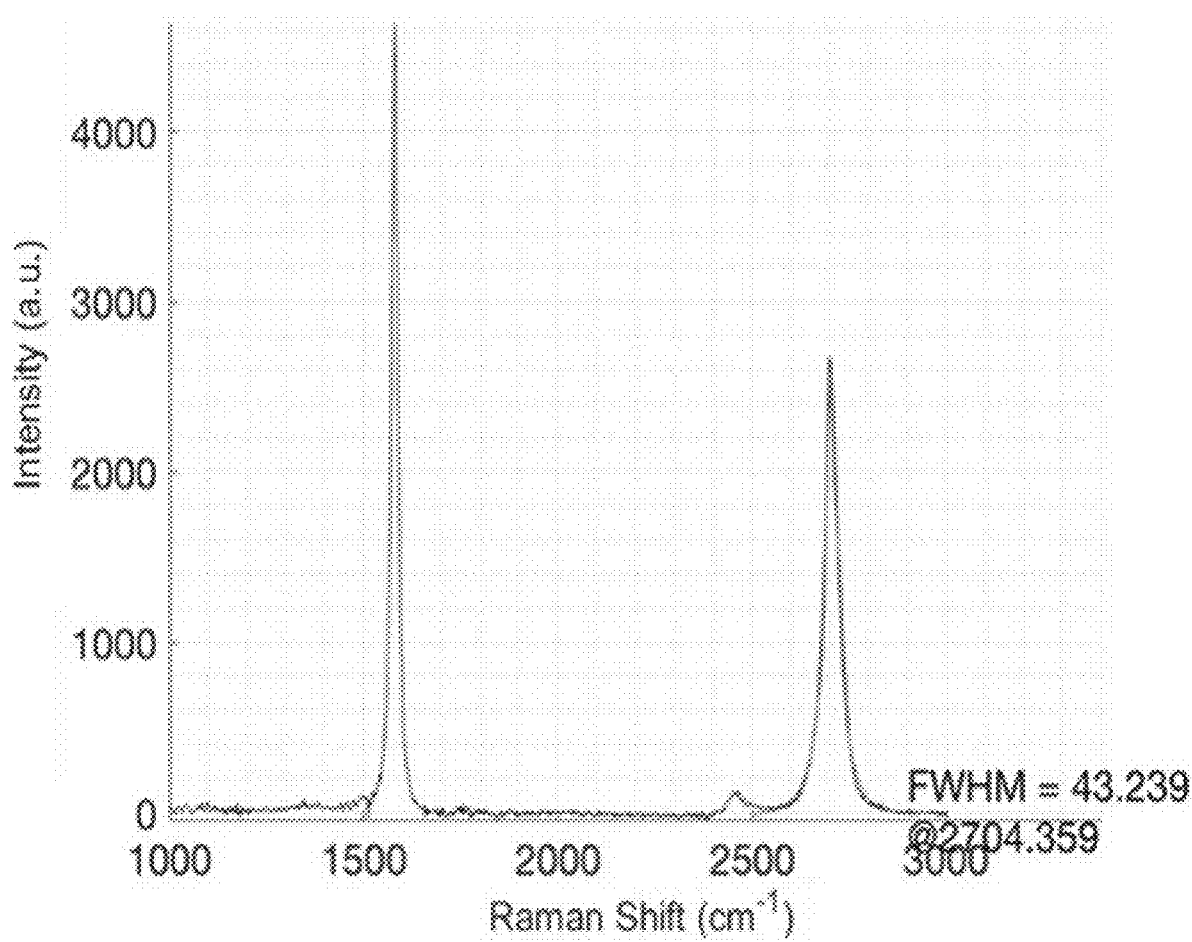
FIG. 18 shows a Raman result of graphene grown in the contrast embodiment 1 of the present invention.
Figure 19:
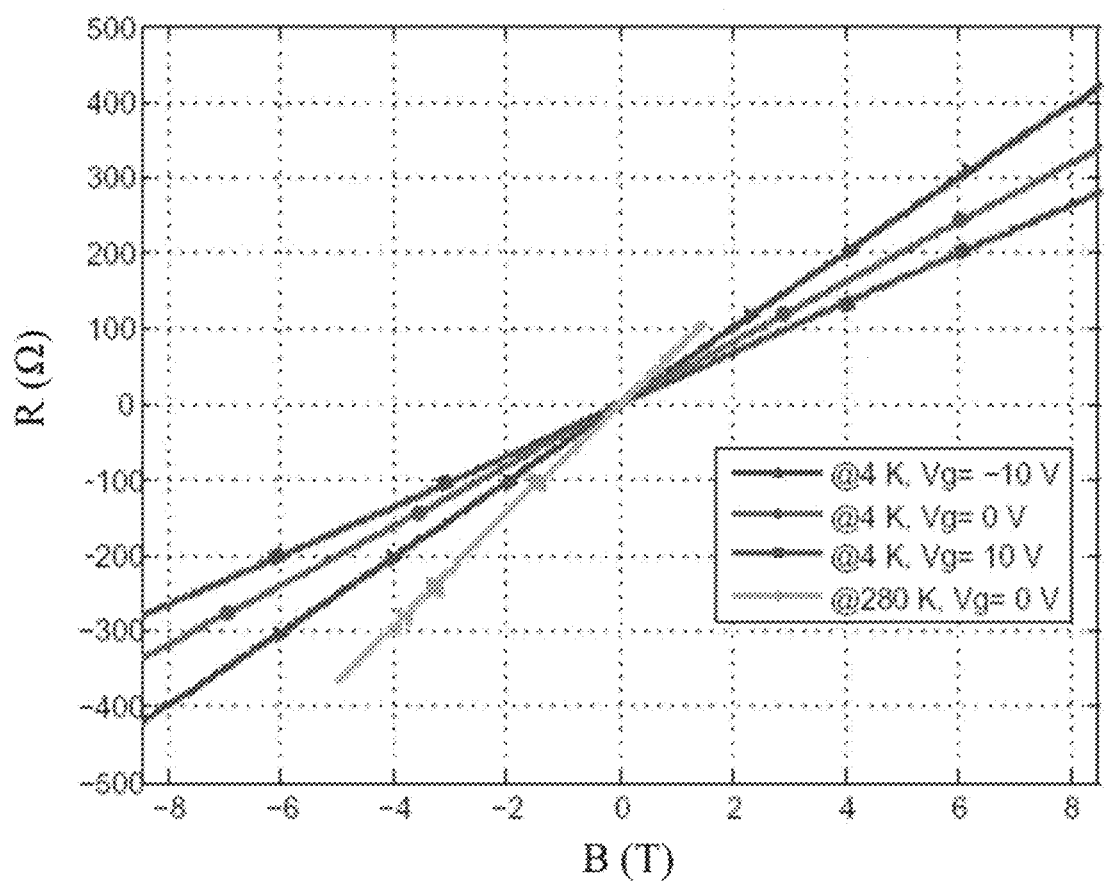
FIG. 19 shows the measurement result of the electrical transport properties of the grown graphene in the contrast embodiment 1 of the present invention.

FIGS. 16, 17 shown the graphene was almost completely covered. FIG. 18 shown the Raman result of growth graphene, the half-height width of the 2D peak is 43, indicating that the obtained graphene was a monolayer and bilayer graphene. FIG. 19 is a graph of electrical transport properties measured on the Si surface.

The above description of the present invention is intended to be merely illustrative, and not restrictive. Therefore, preferred embodiments of the present invention are not limited to the preferred embodiments described above. If a person of ordinary skills in the art receives its enlightenment and does not deviate from the purpose of the present invention and the scope of the claims, other changes or variations shall fall within the scope of the present invention.

What is claimed is:

1. A control method to epitaxial growth monolayer graphene, wherein a monolayer graphene is epitaxially grown on a non-polar crystal face at arbitrary angle of a non-polar crystal face SiC substrate, thereby utilizing the physical properties of the non-polar crystal face and the interaction between the non-polar crystal face and graphene to manipulate the electrical transport properties of graphene;
wherein, the non-polar crystal face SiC substrate is prepared by the following steps:
adjusting an angle of a diamond wire relative to a SiC crystal column according to an included angle between a non-polar crystal face and a (0001) plane or a (000-1) plane, using the diamond wire to cut the SiC crystal column to obtain a SiC wafer, the diamond wire has a diameter of 0.2 to 0.8 mm, and is fed at a speed of 1.5 mm/min to 5 mm/min;
performing grinding, mechanical polishing, and chemical-mechanical polishing to obtain a non-polar crystal face with atomic flatness; wherein, the grinding is performed under the following conditions: a grinding disc or a piece of abrasive paper containing diamond particles having a particle size of 3 to 60 μm is used, where the grinding pressure is 20 to 250 N, and the speed of the power head and the rotating speed of the grinding disc are 30 to 80 r/min and 100 to 300 r/min, respectively; the mechanical polishing is performed under the following conditions: a diamond suspension with a diamond particle size of 0.05 to 9 μm is adopted, where the polishing pressure is 20 to 80 N, the polishing disc is made of synthetic filament cloth, the speed of the power head is 30 to 100 r/min, and the rotating speed of the polishing disc is 60 to 320 r/min; the chemical-mechanical polishing is performed under the following conditions: an alkaline colloidal silica suspension is adopted, preferably with a pH value of 9 to 12, where the polishing pressure is 20 to 80 N, the dropping rate of the polishing solution is 5 to 50 mL/min, a polishing pad of fluff structure is adopted, the speed of the power head is 30 to 100 r/min, and the rotating speed of the polishing disc is 60 to 320 r/min;
cutting the SiC wafer to obtain the non-polar crystal face SiC substrate; wherein the SiC wafer is cut into a small wafer having a length of 3 to 8 mm and a width of 4 to 10 mm as the non-polar crystal face SiC substrate.

2. The control method according to claim 1, wherein the non-polar crystal face SiC substrate is in a hexagonal system, and the non-polar crystal face is a (1-105) plane and forms an included angle of 37.1° with a (0001) plane.

3. The control method according to claim 2, wherein the non-polar crystal face SiC substrate is a 4H—SiC substrate or a 6H—SiC substrate.

4. The control method according to claim 1, wherein the diamond wire has a diameter of 0.6 mm, and is fed at a speed of 3 mm/min.

5. The control method according to claim 1, wherein the grinding is performed under the following conditions: grinding discs with diamond particle sizes of 60 μm and 30 μm are used in order for grinding, where the grinding pressure is gradually increased from 100 to 200 N during grinding, and the speed of the power head and the rotating speed of the grinding disc are 60 r/min and 280 r/min, respectively.

6. The control method according to claim 1, wherein the mechanical polishing is performed under the following conditions: diamond suspensions with diamond particle sizes of 3 μm and 1 μm are adopted in order for polishing, where the polishing pressures are 80 N and 60 N, respectively, and the speed of the power head and the rotating speed of the polishing disc are 80 r/min and 310 r/min, respectively.

7. The control method according to claim 1, wherein the chemical-mechanical polishing is performed under the following conditions: an alkaline colloidal silica suspension with a pH value of 11 is adopted, where a polishing pressure is 60 N, the dropping rate of the polishing solution is 40 mL/min, the speed of the power head is 60 r/min, and the rotating speed of the polishing disc is 120 r/min.

8. The control method according to claim 1, wherein the graphene is grown by SiC pyrolysis by the following specific steps:
pretreating a non-polar crystal face SiC substrate;
heating the pretreated non-polar crystal face SiC substrate in vacuum at the temperature of 500 to 900° C. for 20 to 60 minutes;
heating the non-polar crystal face SiC substrate in an inert atmosphere to 1100 to 1350° C., for 20 to 100 minutes, and then heated to 1500 to 1600° C., for 20 to 150 minutes; and
the growth of graphene is finished after cooling to room temperature.

9. The control method according to claim 1, wherein graphene is grown by SiC pyrolysis by the following specific steps:
pretreating a non-polar crystal face SiC substrate;
heating the pretreated non-polar crystal face SiC substrate in vacuum at the temperature of 500° C. for 60 minutes;
heating the non-polar crystal face SiC substrate in an inert atmosphere to 1100° C. for 80 minutes, and then heated to 1500° C., for 120 minutes; and
the growth of graphene is finished after cooling to room temperature.

10. The control method according to claim 1, wherein the graphene being grown by spin-coating an organic substance on the non-polar crystal face SiC substrate as a solid carbon source, including the following steps:
pretreating a non-polar crystal face SiC substrate;
spin-coating an organic substance on the pretreated non-polar crystal face SiC substrate with a thickness of 10-100 nm;
heating the non-polar crystal face SiC substrate in vacuum at the temperature of 500 to 1000° C. for 20 to 60 minutes;
heating the non-polar crystal face SiC substrate in an inert atmosphere to 1200 to 1400° C. for 20 to 100 minutes, and then heating to 1700° C. for 115 minutes; and
the growth of graphene is finished after cooling to room temperature.

11. The control method according to claim 1, wherein graphene is grown by spin-coating an organic substance on the non-polar crystal face SiC substrate as a solid carbon source, including the following steps:
pretreating a non-polar crystal face SiC substrate;
spin-coating an organic substance on the pretreated non-polar crystal face SiC substrate with a thickness of 10-100 nm;
heating the non-polar crystal face SiC substrate in vacuum at the temperature of 800° C. for 40 minutes;
heating the non-polar crystal face SiC substrate in an inert atmosphere to 1400° C., for 81 minutes, and then heating to 1700° C. for 115 minutes; and
the growth of graphene is finished after cooling to room temperature.

12. The control method according to claim 6, wherein the organic substance is photoresist, polystyrene or polyacrylonitrile.

13. A method for preparing a non-polar crystal face SiC substrate, includes the following steps:
adjusting an angle of a diamond wire relative to a SiC crystal column according to an included angle between a non-polar crystal face and a (0001) plane or a (000-1) plane, using the diamond wire to cut the SiC crystal column to obtain a SiC wafer; wherein the diamond wire has a diameter of 0.2 to 0.8 mm, and is fed at a speed of 1.5 mm/min to 5 mm/min;
performing grinding, mechanical polishing, and chemical-mechanical polishing to obtain a non-polar crystal face with atomic flatness; wherein, the grinding is performed under the following conditions: a grinding disc or a piece of abrasive paper containing diamond particles having a particle size of 3 to 60 μm is used, where the grinding pressure is 20 to 250 N, and the speed of the power head and the rotating speed of the grinding disc are 30 to 80 r/min and 100 to 300 r/min, respectively;
the mechanical polishing is performed under the following conditions: a diamond suspension with a diamond particle size of 0.05 to 9 μm is adopted, where the polishing pressure is 20 to 80 N, the polishing disc is made of synthetic filament cloth, the speed of the power head is 30 to 100 r/min, and the rotating speed of the polishing disc is 60 to 320 r/min;
the chemical-mechanical polishing is performed under the following conditions: an alkaline colloidal silica suspension is adopted, preferably with a pH value of 9 to 12, where the polishing pressure is 20 to 80 N, the dropping rate of the polishing solution is 5 to 50 mL/min, a polishing pad of fluff structure is adopted, the speed of the power head is 30 to 100 r/min, and the rotating speed of the polishing disc is 60 to 320 r/min;
cutting the SiC wafer to obtain the non-polar crystal face SiC substrate;
wherein the SiC wafer is cut into a small wafer having a length of 3 to 8 mm and a width of 4 to 10 mm as the non-polar crystal face SiC substrate.

14. The method according to claim 8, wherein the diamond wire has a diameter of 0.6 mm, and is fed at a speed of 3 mm/min.

15. The method according to claim 8, wherein the grinding is performed under the following conditions: grinding discs with diamond particle sizes of 60 μm and 30 μm are used in order for grinding, where the grinding pressure is gradually increased from 100 to 200 N during grinding, and the speed of the power head and the rotating speed of the grinding disc are 60 r/min and 280 r/min, respectively.

16. The method according to claim 8, wherein the mechanical polishing is performed under the following conditions: diamond suspensions with diamond particle sizes of 3 μm and 1 μm are adopted in order for polishing, where the polishing pressures are 80 N and 60 N, respectively, and the speed of the power head and the rotating speed of the polishing disc are 80 r/min and 310 r/min, respectively.

17. The method according to claim 13, wherein the chemical-mechanical polishing is performed under the following conditions: an alkaline colloidal silica suspension with a pH value of 11 is adopted, where a polishing pressure is 60 N, the dropping rate of the polishing solution is 40 mL/min, the speed of the power head is 60 r/min, and the rotating speed of the polishing disc is 120 r/min.

* * * * *